(12) United States Patent
MacPherson

(10) Patent No.: US 6,348,742 B1
(45) Date of Patent: *Feb. 19, 2002

(54) SACRIFICIAL BOND PADS FOR LASER CONFIGURED INTEGRATED CIRCUITS

(75) Inventor: John MacPherson, Fremont, CA (US)

(73) Assignee: Clear Logic, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/236,523

(22) Filed: Jan. 25, 1999

(51) Int. Cl.[7] .................. H01L 23/48; H01L 29/40; G01R 31/26; G09K 3/00
(52) U.S. Cl. .................. 257/786; 257/784; 257/659; 257/503; 257/783; 257/787; 257/692; 257/48; 257/480; 257/773; 324/754; 324/765; 324/158.1; 324/54; 324/762; 324/758
(58) Field of Search .................. 257/784, 786, 257/659, 503, 783, 692, 787, 48, 680, 773; 324/754–765, 945, 158.1

(56) References Cited

U.S. PATENT DOCUMENTS

| | | | | |
|---|---|---|---|---|
| 4,237,379 A | * | 12/1980 | Deckert et al. | 250/302 |
| 5,315,241 A | * | 5/1994 | Ewers | 324/158 R |
| 5,532,614 A | * | 7/1996 | Chin | 324/163 |
| 5,554,940 A | * | 9/1996 | Hubacher | 324/765 |
| 5,783,868 A | * | 7/1998 | Galloway | 257/784 |
| 5,785,538 A | * | 7/1998 | Beaman et al. | 439/91 |
| 5,844,317 A | * | 12/1998 | Bertolet et al. | 257/773 |
| 5,914,614 A | * | 6/1999 | Beaman et al. | 324/754 |
| 6,025,737 A | * | 2/2000 | Hembree et al. | 324/758 |
| 6,068,892 A | * | 5/2000 | Ma | 428/14 |
| 6,104,087 A | * | 8/2000 | DiStefeno et al. | 257/496 |
| 6,133,627 A | * | 10/2000 | Khandros et al. | 257/692 |
| 6,143,355 A | * | 11/2000 | Walsh et al. | 427/8 |
| 6,150,193 A | * | 11/2000 | Glenn | 438/113 |
| 6,215,196 B1 | * | 4/2001 | Eldridge et al. | 257/784 |
| 6,259,608 B1 | * | 7/2001 | Berardinelli et al. | 257/786 |
| 2001/0001541 A1 | * | 5/2001 | Bell | 324/754 |

* cited by examiner

Primary Examiner—Alexander O. Williams
(74) Attorney, Agent, or Firm—Skjerven Morrill MacPherson LLP; Tom Chen

(57) ABSTRACT

A bond pad structure is provided which has a primary bond pad region electrically connected to a secondary bond pad region. The secondary bond pad region is used to test a circuit for configuration, while the primary bond pad is covered with a protective oxide. After configuration and etching to complete desired disconnections, the oxide is removed from the primary bond pad region, leaving an undamaged surface for subsequent wire bonding. The primary bond pad region and the secondary bond pad region can be a unitary structure or two separate structures.

13 Claims, 6 Drawing Sheets

SACRIFICIAL BOND PADS FOR LASER CONFIGURED INTEGRATED CIRCUITS

BACKGROUND

1. Field of the Invention

This invention relates generally to the manufacture of semiconductor devices, and in particular to devices with laser-configurable fuses that can be selectively blown to achieve different circuit functions and capabilities.

2. Description of Related Art

Due to the ever-increasing number of applications and uses for integrated circuits, two primary objectives for IC manufacturers are the ability to customize circuits for specific uses and the ability to quickly turn around a circuit prototype to the customer. One method of customizing or configuring circuits is to utilize laser fuses to alter the structure, path, or electrical characteristics of the semiconductor device. Laser fuses, which also refer to antifuses, can also be used to repair memory elements. In particular, fuses have been used to: (1) repair non-functional devices through the selective deletion of defective portions of the circuitry or the substitution of functional redundant circuitry for the defective portions of the circuitry; (2) mark the device for identification of characteristics in a manner that is readable visually or electrically, e.g., serialization of the integrated circuit or how the device has been configured by the laser; and (3) customize an integrated circuit such that the integrated circuit has specific circuit or electrical characteristics.

Typically, the fuse elements are disconnected (blown) by irradiating the fuse with a targeting energy beam, hereinafter generally referred to as a laser, or by applying an electrical current to the fuse. Suitable materials for the fuse include but are not limited to Al, AlCu, AlSiCu, Cu, Ti, TiN, TiW, W, WSi, polycrystalline Si, and TiSi. It is common for the fuse to be covered by an insulating layer of silicon oxide, silicon nitride, or other insulating materials, which are applied as inter-conductive dielectric layers, and/or as part of a final passivation layer to protect the device from moisture and scratches.

The fuse disconnection process begins when the fuse body is heated by the laser, resulting in a change in the fuse material from a solid state to a liquid, vapor, or liquid/vapor state. The insulation layer covering the fuse is helpful to this process because the insulation layer retains heat and results in a more complete and uniform vaporization of the fuse material. Preferentially, the resulting pressure from the vaporization of the fuse causes the overlying insulation to be "blown open" or rupture, allowing the vaporized fuse material to escape, and thereby completing the disconnection. If the insulation layer is too thin, the insulation layer may rupture prematurely, i.e., before the heat has propagated through the fuse body, thereby allowing heat to escape and resulting in an incomplete vaporization of the fuse (underblown). On the other hand, if the insulation layer is too thick, the insulation layer may rupture late or not at all, which can result in structural damage to the insulating layer and occasionally to surrounding circuit elements (overblown). The optimal thickness of the insulation layer varies with its composition and the fuse characteristics, but is generally maintained between 1000 Å and 6000 Å, and should be approximately uniform over the fuse elements across the circuit to increase the repeatability of the fuse disconnection process. Since this is thinner than most dielectric or passivation layers, an opening or window is typically etched into the layer to provide the desired thickness over the fuses. Variations in the thickness of the fuse material, the registration of the laser spot with respect to the center of the fuse, and other factors can also result in the fuse being underblown or overblown.

FIG. 1A shows a top view of a laser-configured fuse structure 10 formed on and covered with a layer of insulating material, such as a silicon oxide 11. Fuse structure 10 includes a fuse body 12 and two fuse terminals 13, which are connected to underlying circuit elements. Fuse body 12 is blown to sever the connection between the underlying elements, creating a disconnection hole 14 in the oxide 11. FIGS. 1B and 1C are cross sectional views of the device in FIG. 1A along sectional lines A–A'. FIG. 1B shows a situation where the fuse blowing process results in an underblown fuse. Because the fuse body is not completely blown (e.g., due to insufficient heat diffusion), a portion 15 of the fuse body may remain in the corner or other areas of the disconnect hole 14. If the portion 15 extends to both fuse terminals, an electrical connection between the fuse terminals still exists. Since the disconnection was not completed, the circuit will not function as intended. FIG. 1C shows a situation where the fuse blowing process results in an overblown fuse. In this case, a crack 16 can form along an edge or edges of the disconnect hole 14. The crack may be formed from the pressure of the vaporizing fuse or from molten material being forced into the oxide 11 (commonly referred to as a "hillock"). Residual metal 17 from the fuse body may remain in the crack 16 to electrically connect the two fuse terminals, with the result that the circuit will not function as desired. Thus, when a fuse is underblown or overblown, residual fuse material may remain which retains an undesired electrical connection between the fuse terminals.

A technique used to improve the yield of circuits that utilize laser-configured fuses is to follow the laser configuration step with an etching step, which removes at least a portion of the residual fuse material and completes the disconnection. This etch can either be performed in a plasma etcher or through the use of wet chemicals. It is essential that the circuit be protected by a passivation layer or other protective layer that has a relatively slow etch rate compared to that of the fuse material, so that other circuit elements formed from the same material or materials having a similar etch rate to that of the fuse are not etched away or damaged during the post-laser etching.

However, the passivation layer may hinder testing of circuits that require testing prior to laser configuration, such as microprocessors with memory or configurable logic, fuse-programmable ASICs and other logic devices, and other circuits which provide redundant elements to serve as replacements for defective circuit elements. Testing is performed prior to laser configuration to identify which circuit areas that are defective and should be disconnected from the circuit, and which redundant elements need to be connected to replace the defective ones. Testing typically involves applying test probes to the surface of bond pads to provide an electrically conductive path between the tester and the circuit elements. In order for the test probes to make good electrical contact with the bond pads, the bond pads must be exposed and free of oxide or other passivating material. However, if the bond pads are comprised of material that has similar etching characteristics to the fuse material, the passivating material is needed to protect the bond pads from damage due to the post-laser etching. Without the passivating material, the bond pads may be etched and become eroded during the post-laser etching. Depending on the degree of the post-laser etching, the top layer of the bond pad may be either completely or partially etched away. In either case, problems may arise when attempting to connect bond wires to the bond pads. The bond wires may either fail to adhere to the bond pads during the bonding process, or they may break loose from the bond pads at a later date. Thus, the quality of the connection between the bond wires and the bond pads will be degraded, resulting in possible faulty, unreliable, or sub-standard devices.

In order to avoid an undesirable etching of the bond pads, photoresist may be applied to the circuit and patterned in such a way as to cover the bond pads, but leave the fuse regions uncovered. This requires the additional time and expense of making a mask to form the desired pattern on the photoresist and of performing another masking process step, thereby increasing the cost and decreasing the yield of the device. Furthermore, any residual resist left remaining over the unvaporized metal between the connection terminals will protect the metal from the post-laser etch. As a result, the resist will prevent the remaining metal from being removed, which prevents the desired electrical disconnection to be completed.

Accordingly, it is desirable to have the ability to perform testing and post-configuration etching without damaging the bond pads that will be bonded to wires without the time and expense associated with further masking and processing steps.

SUMMARY

In accordance with the present invention, a bond pad is provided having a primary bond pad region and a secondary bond pad region, where the secondary bond pad region is contacted by a probe during testing. Both bond pad regions are initially covered with an oxide. Prior to testing, the oxide is retained over the primary bond pad region, but removed over the secondary bond pad region. The secondary pad region is electrically connected to its associated primary bond pad. Thus, the device can be tested for functionality by applying a probe to the exposed secondary pad region. If the device is non-functional but can be repaired by invoking redundant circuits, laser configuration or some other fuse blowing process is then performed, followed by a post-configuration etch to complete the desired disconnections. The post-configuration etch will damage the secondary bond pad region, but will not affect the primary bond pad region because it is protected by the oxide. The oxide can then be removed over the primary pad region and the device given a final test for functionality. If the device is functional, it can be packaged, with the bond wires attached to the undamaged primary bond pad region.

In one embodiment of the present invention, the bond pad area is increased. Thus, the primary bond pad region and the secondary bond pad region form a unitary bond pad structure. A portion of the oxide is removed over the bond pad (over the secondary region) to expose the secondary region for testing. After the post-configuration etch is completed, the remaining oxide is removed from the bond pad (over the primary region), and the wire is bonded to the area previously protected by the oxide.

In another embodiment of the present invention, a separate secondary bond pad is created for every available bond pad on the device. The secondary bond pads are separate from, but electrically connected to, their associated primary bond pads. The oxide is removed over the secondary bond pads to expose them for testing. After the post-configuration etch is completed, the oxide is removed from the primary bond pads, and the wires are bonded to the undamaged primary bond pads.

The present invention will be more fully understood upon consideration of the detailed description below, taken together with the accompanying drawings.

BRIEF DESCRIPTION OF THE DRAWINGS

Use of the same reference symbols in different figures indicates similar or identical elements.

DETAILED DESCRIPTION OF THE PREFERRED EMBODIMENTS

In accordance with the present invention, secondary bond pads are electrically connected to primary bond pads, with both types initially covered with oxide or other passivating material. Prior to testing the device, the oxide over the secondary bond pads are removed to expose the secondary bond pads and their associated fuses for testing. After desired fuses have been blown, such as by laser configuration, a post-laser etch is performed to complete the desired disconnections. The unprotected secondary bond pads may be damaged during the post-laser etch. However, the primary bond pads are undamaged because the primary bond pads remain covered with the oxide. After the post-laser etch, the oxide over the primary bond pads are removed, and bond wires can be properly attached to undamaged bond pads.

Figure 1A:
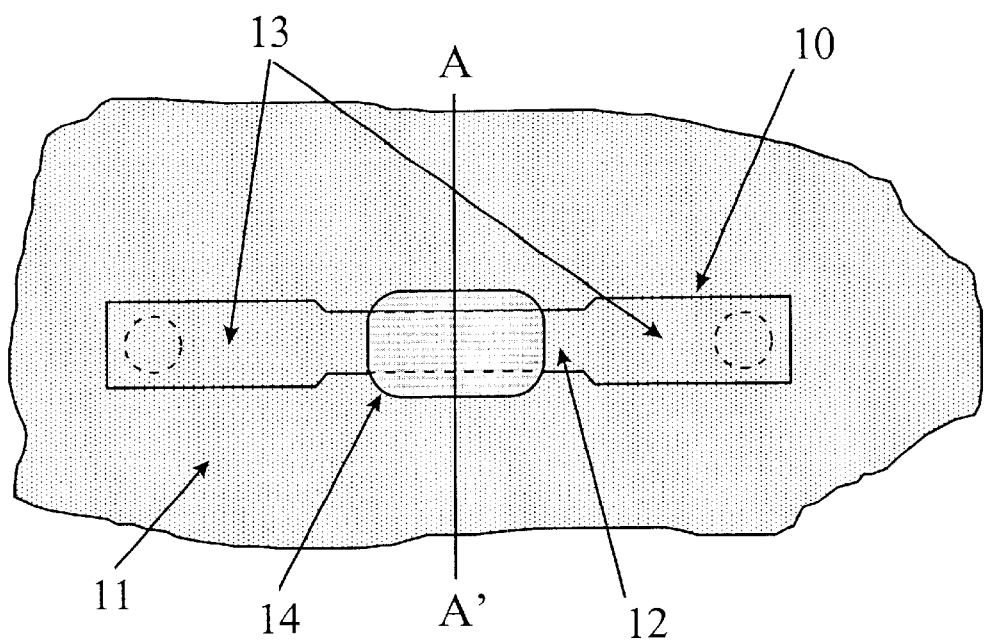
FIG. 1A is a top view of device with a conventional laser-configured fuse structure.
Figure 1B:
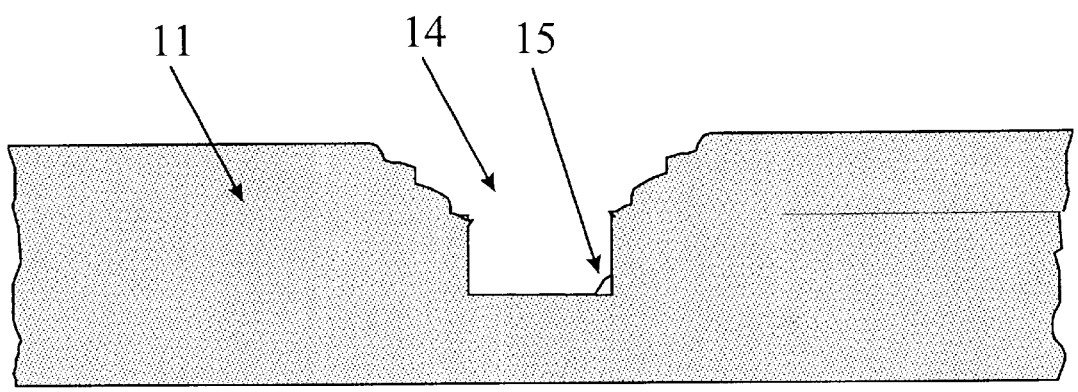
FIG. 1B is a cross-sectional view of the device of FIG. 1A along sectional lines A–A' after configuration where the fuse is underblown.
Figure 1C:
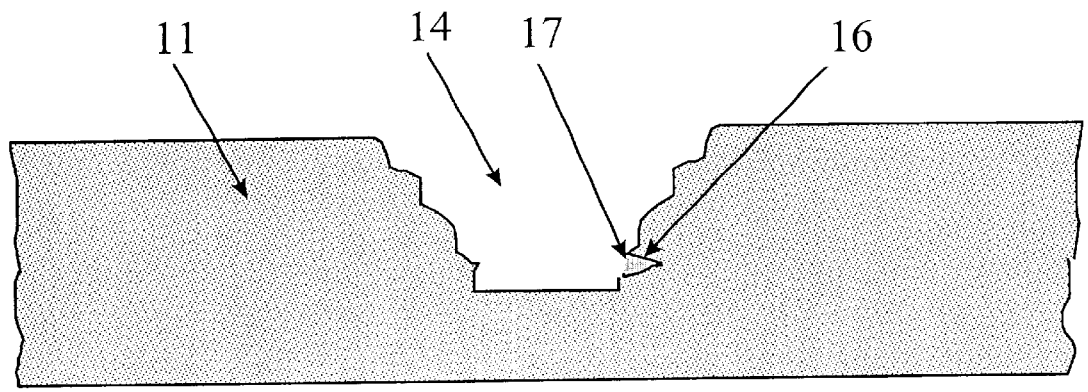
FIG. 1C is a cross-sectional view of the device of FIG. 1A along sectional lines A–A' after configuration where the fuse is overblown.
Figure 2:
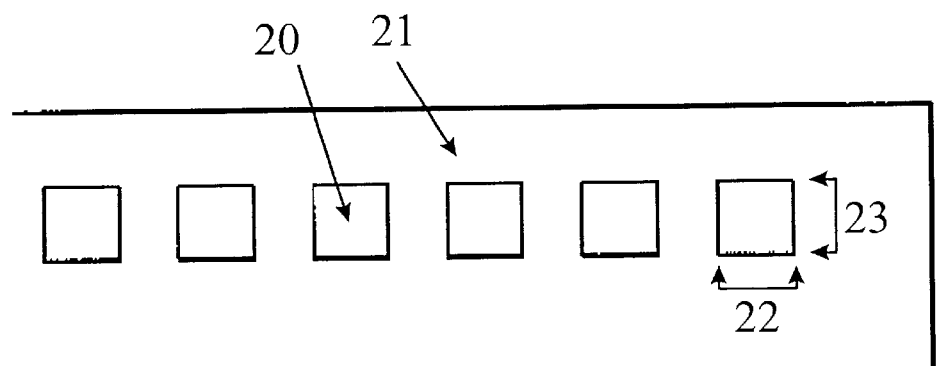
FIG. 2 is a top view of a conventional bond pad layout.

FIG. 2 shows a top view of a portion of a conventional bond pad layout as is well known in the art. Bond pads 20 are arranged in the general region of the periphery of a device 21, such as a fuse-configurable integrated circuit. Bond pads 20 are used both as contact points for test probes during electrical testing of the device and as connection points for bond wires to create an electrically conductive pathway between the package pins and the device. Contact by the probes or connection by the bond wires can occur within any surface portion of the bond pads 20. Typical dimensions for width 22 and length 23 of the bond pads 20 are prescribed according to a particular set of design rules for the device and the assembly process used to package the device. The width 22 and length 23 of the bond pads 20 are shown as approximately equal for ease of illustration.

Figure 3:
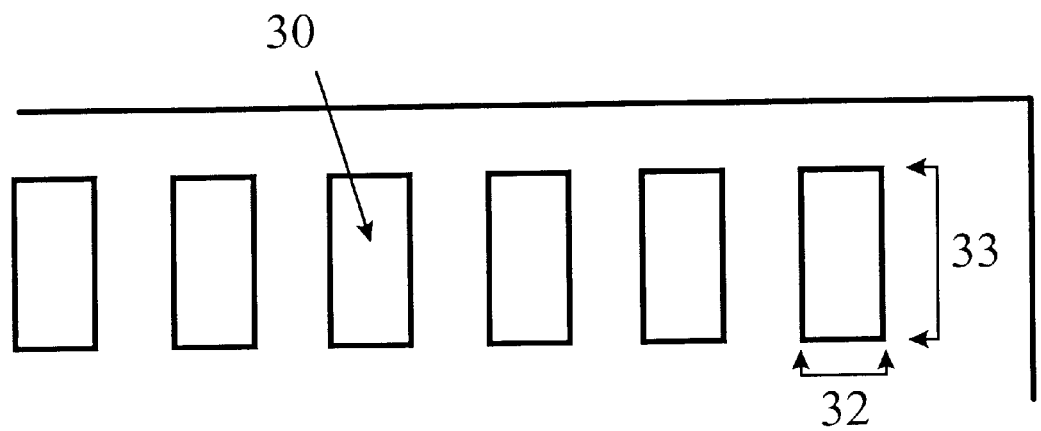
FIG. 3 is a top view of a bond pad layout according to one embodiment of the present invention.
Figure 4:
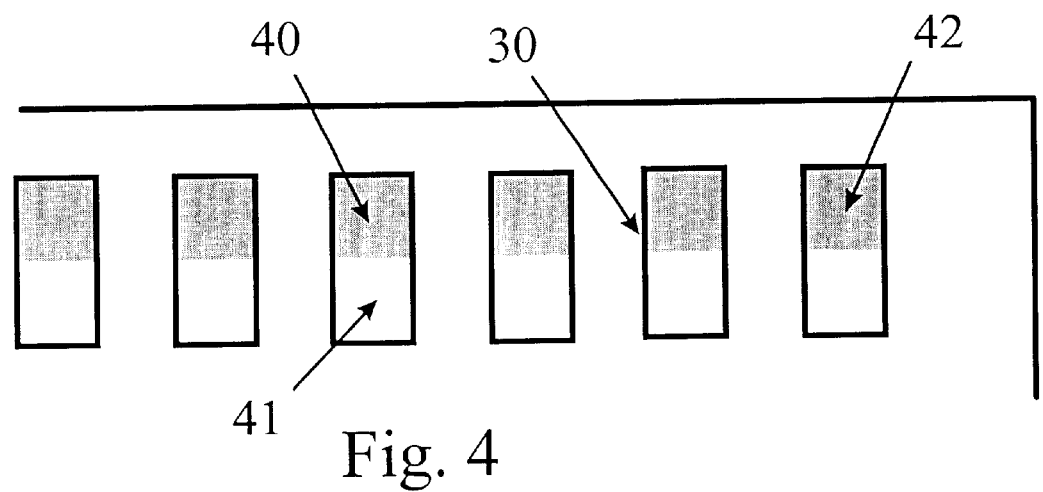
FIGS. 4–7 are top views of the bond pads of FIG. 3 after various processing steps.

FIG. 3 shows a bond pad design and layout in accordance with one embodiment of the present invention, in which the area of the bond pad is increased to form a secondary bond pad region and a primary bond pad region. Thus, the primary and second bond pad regions form a single unitary bond pad structure. Bond pads 30 have width dimensions 32 that are prescribed by the design rules (e.g., the same width 22 as the bond pads in FIG. 2). However, the length 33 of bond pads 30 is increased to about twice that prescribed by the design rules (e.g., twice the length 23 of the bond pads in FIG. 2). Thus, as seen in FIG. 4, primary pad regions 42 and secondary pad regions 41 are both approximately the same width and length as bond pads prescribed by design rules. During the fabrication process, bond pads 30 are covered with a layer of oxide 40 or other passivating material. Conventional masking and etch processes are performed to remove the oxide 40 over secondary pad regions 41, exposing about half of the total pad area, as shown in FIG. 4. Primary pad regions 42, which make electrical contact with the underlying fuses (not shown), remain covered with oxide 40.

Figure 5:
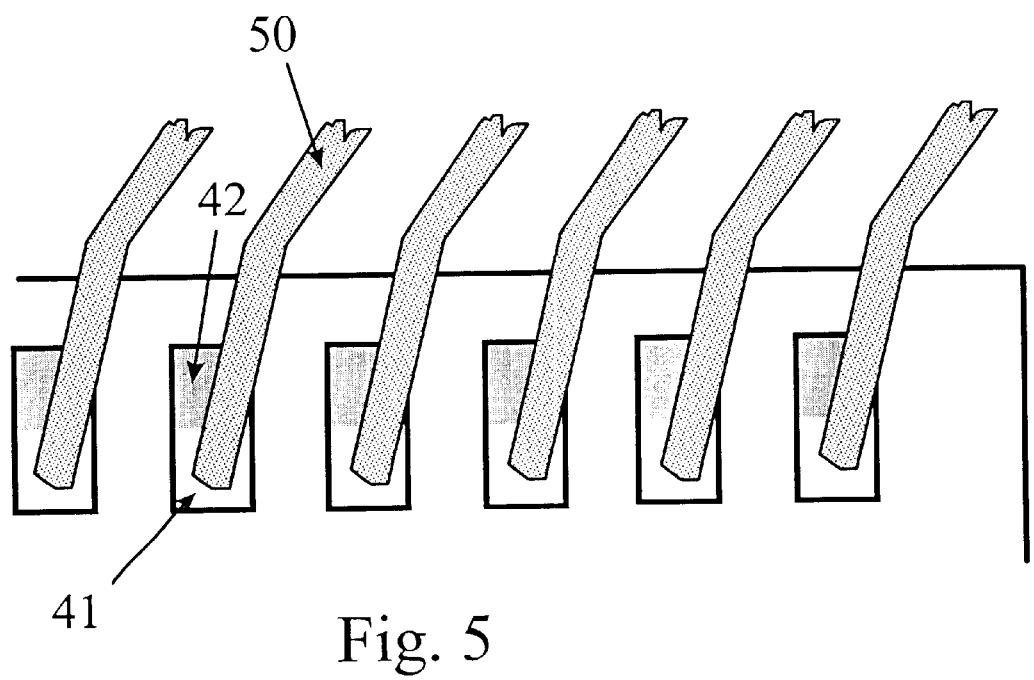
Figure 6:
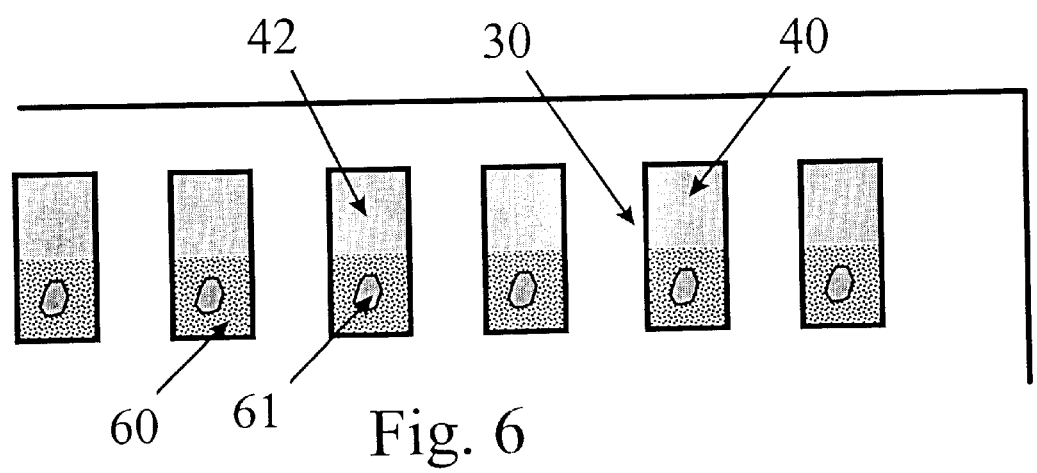
Figure 7:
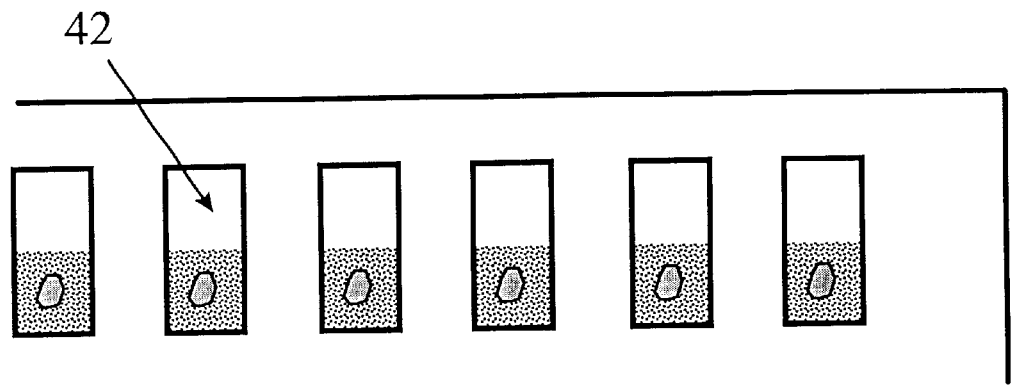

When the device is to be tested, probes 50 are applied to secondary pad regions 41 to perform the testing, as shown in FIG. 5. Contact with secondary pad regions 41 allows the underlying fuse connections to be tested because secondary pad regions 41 are electrically connected to primary pad regions 42. The testing identifies areas on the device which require laser configuration. After laser configuration or some other fuse blowing process to disconnect or otherwise configure the identified areas, a conventional post-laser or post-configuration etch is performed to remove residual fuse material and complete the desired fuse disconnections. As shown in FIG. 6, the post-laser etch also damages regions 60 of the bond pad around contact points 61 of the test probes and removes most or all of the material at contact points 61. However, the other portions (the primary pad regions 42) of bond pads 30 are protected from the etch by oxide 40. The remaining portions of oxide 40 are then removed by conventional etching techniques, leaving primary pad regions 42 with undamaged surfaces for subsequent wire bonding, as shown FIG. 7.

Figure 8:
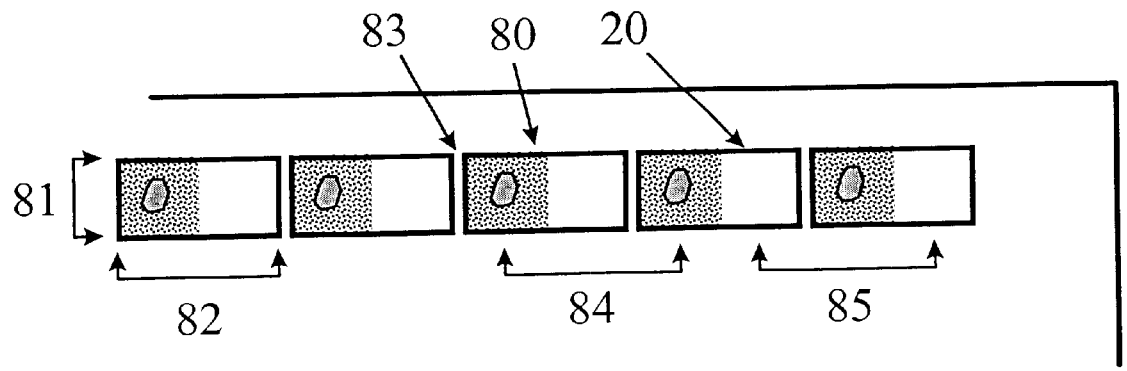
FIG. 8 is a top view of a bond pad layout according to another embodiment of FIG. 3.

Alternatively, the bond pad design of the present invention could be oriented in other ways that would more effectively suit the needs of a particular device. For example, as shown in FIG. 8, bond pads 80 can have the same length dimension 81 as dictated by the design rules, but have the width dimension 82 widened, such as to twice the width prescribed by the design rules. The spacing 83 between adjacent bond pads 80 can be decreased, while maintaining the same probe pitch 84 and the same bonding pitch 85. Other bond pad sizes or geometries can be used to implement primary pad regions for wire bonding and secondary pad regions for test probing.

Figure 9:
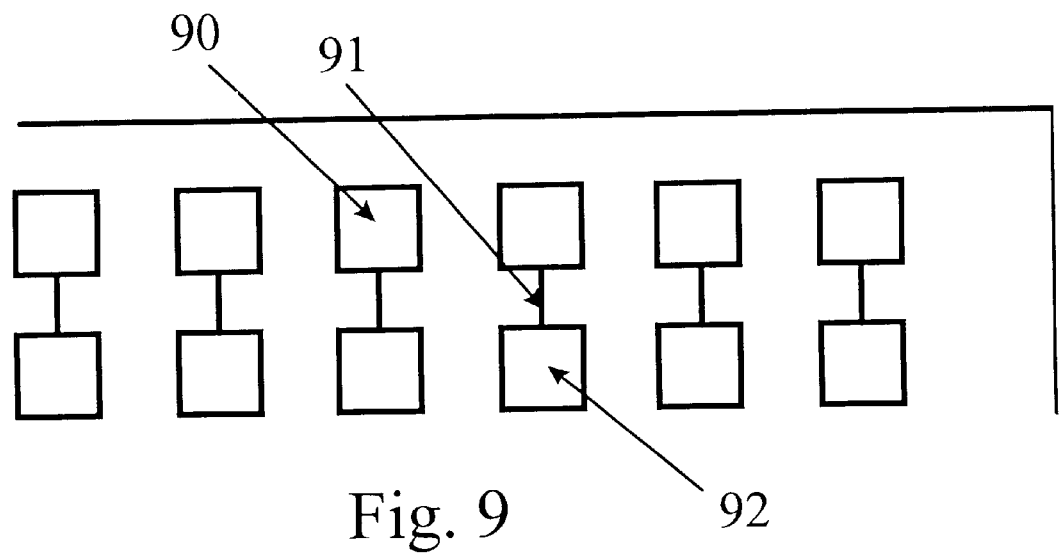
FIG. 9 is a top view of a bond pad layout according to another embodiment of the present invention.

In another embodiment of the present invention, the secondary bond pad is separate from, but electrically connected to, the primary bond pad. FIG. 9 shows a simplified layout of the bond pads according to this embodiment. Primary bond pads 90 are connected via a patterned interconnect 91 to secondary bond pads 92. As will be obvious to those skilled in the art, the secondary bond pads 92 do not necessarily need to be located in proximity to the primary bond pads 90, but could be located elsewhere at the perimeter or even within the core portion of the device. The patterned interconnect 91 could be comprised of interconnect lines at a plurality of different layers, joined by vias between layers.

Figure 10:
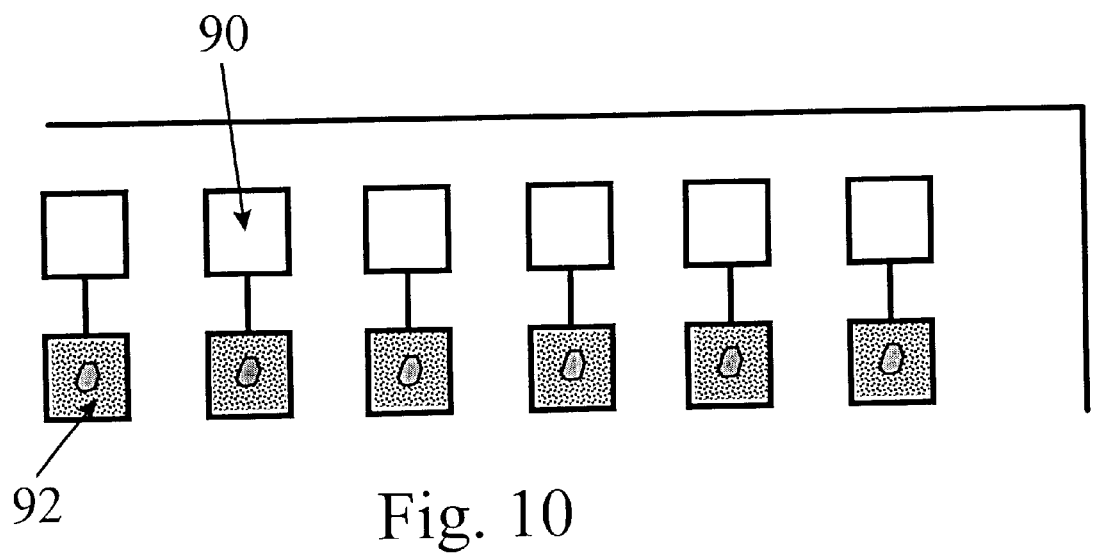
FIG. 10 is a top view of the bond pads of FIG. 9 after testing and etching and prior to wire bonding.

With the bond pad configuration of FIG. 9 or other similar configurations, the device can be tested, configured, and etched using steps similar to those described above with respect to FIGS. 4–7. The electrical connection between secondary bond pads 92 and primary bond pads 90 allows test probes applied to secondary pads 92 to test fuse connections for primary pads 90. After laser configuration or some other fuse blowing process and a post-laser etch, the primary bond pads 90, which are covered with an oxide or other passivation material, remain undamaged. The oxide from primary bond pads 90 is then removed, thereby leaving undamaged surfaces for subsequent wire bonding, as shown in FIG. 10.

Thus, probes can be applied to the bond pads for testing without damaging bond pad regions where bond wires are to be attached. In all embodiments of the present invention, the secondary pad region is shown to be of approximately the same area as the primary pad region. However, the present invention permits both regions to have their respective areas optimized for their particular applications without affecting the other.

The present invention is particularly suitable for devices, such as microprocessors and application-specific integrated circuits (ASICs) which utilize Boundary Scan testing. This type of testing requires only six probe contact pads: four control pads to control the basic operation, a power pad, and a ground pad. Optionally, a second power pad may be added if there are separate power pads for core and input/output logic, and a fifth control pad can be added to provide an asynchronous reset signal to the Test Access Port controller.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

What is claimed is:

1. A bond pad structure formed on a semiconductor device, the bond pad structure comprising:

a primary bond pad region for electrically connecting an underlying circuit element to an external contact; and a secondary bond pad region for testing said underlying circuit element for configuration, wherein said secondary bond pad region is electrically connected to said primary bond pad region, wherein said secondary bond pad region remains on the device after testing, and wherein said primary bond pad region is completely covered by a passivation layer, and said secondary bond region is exposed for testing said underlying circuit element for configuration prior to first connecting said primary bond pad region to said external contact.

2. The structure of claim 1, wherein said primary bond pad region and said secondary bond pad region form a unitary structure.

3. The structure of claim 1, wherein said primary bond pad region and said secondary bond pad region are separate structures.

4. The structure of claim 1, further comprising a patterned interconnect electrically connecting said primary bond pad region and said secondary bond pad region.

5. The structure of claim 1, wherein said primary bond pad region is electrically connected to said underlying circuit element.

6. The structure of claim 1, wherein said primary bond pad region and said secondary bond pad region are approximately the same size.

7. A bond pad structure, comprising:

a primary bond pad region for electrically connecting an underlying circuit element to an external contact; and a secondary bond pad region electrically connected to the primary bond pad region for testing said underlying circuit element for configuration, wherein said primary and secondary bond pad regions form a unitary structure, and wherein said primary bond pad region is completely covered by a passivation layer, and said secondary bond region is exposed for testing said underlying circuit element for configuration prior to first connecting said primary bond pad region to said external contact.

8. The structure of claim 1, wherein the passivation layer is formed before connecting said primary bond pad region to said external contact.

9. The structure of claim 1, wherein the passivation layer is removed before connecting said primary bond pad region to said external contact.

10. The structure of claim 1, wherein the passivation layer is formed before a post-configuration etch is performed.

11. The structure of claim 7, wherein the passivation layer is formed before connecting said primary bond pad region to said external contact.

12. The structure of claim 7, wherein the passivation layer is removed before connecting said primary bond pad region to said external contact.

13. The structure of claim 7, wherein the passivation layer is formed before a post-configuration etch is performed.

* * * * *